(12) United States Patent
Lee et al.

(10) Patent No.: US 8,075,985 B2
(45) Date of Patent: Dec. 13, 2011

(54) METALLIZED BIAXIALLY ORIENTED POLYPROPYLENE FILM WITH HIGH METAL ADHESION

(75) Inventors: Mark S. Lee, North Kingstown, RI (US); Tien-Kuei Su, Somerset, NJ (US)

(73) Assignee: Toray Plastics (America), Inc., North Kingstown, RI (US)

( * ) Notice: Subject to any disclaimer, the term of this patent is extended or adjusted under 35 U.S.C. 154(b) by 557 days.

(21) Appl. No.: 11/806,998

(22) Filed: Jun. 5, 2007

(65) Prior Publication Data

US 2007/0292682 A1 Dec. 20, 2007

Related U.S. Application Data

(60) Provisional application No. 60/811,113, filed on Jun. 6, 2006.

(51) Int. Cl.
*B32B 7/02* (2006.01)

(52) U.S. Cl. ........ 428/212; 428/336; 428/461; 428/515; 428/516

(58) Field of Classification Search .............. 428/212, 428/336, 461, 515, 516
See application file for complete search history.

(56) References Cited

U.S. PATENT DOCUMENTS

| 5,194,318 | A |   | 3/1993  | Migliorini et al. |         |
|-----------|---|---|---------|-------------------|---------|
| 5,281,483 | A |   | 1/1994  | Hwo               |         |
| 5,443,915 | A | * | 8/1995  | Wilkie et al.     | 428/461 |
| 5,698,317 | A |   | 12/1997 | Kurokawa et al.   |         |
| 5,922,471 | A |   | 7/1999  | Chatterjee        |         |
| 5,958,566 | A |   | 9/1999  | Wheat et al.      |         |
| 6,033,786 | A |   | 3/2000  | Fatica et al.     |         |
| 6,106,933 | A |   | 8/2000  | Nagai et al.      |         |
| 6,190,760 | B1 |  | 2/2001  | Nagai et al.      |         |
| 6,395,147 | B1 | * | 5/2002  | Wheat et al.     | 204/192.14 |
| 6,503,635 | B1 |  | 1/2003  | Kong et al.       |         |
| 2004/0166337 | A1 | | 8/2004 | Chang et al.      |         |

FOREIGN PATENT DOCUMENTS

| EP | 0 329 336 A2 | 8/1989 |
| EP | 0 925 912 A2 | 6/1999 |
| WO | WO-96/16787 A | 6/1996 |

OTHER PUBLICATIONS

European Search Report dated Sep. 7, 2007, directed to counterpart EP Application No. 07011105.9 (6 pages).

* cited by examiner

*Primary Examiner* — Mark Ruthkosky
*Assistant Examiner* — Lawrence Ferguson
(74) *Attorney, Agent, or Firm* — Morrison & Foerster LLP

(57) ABSTRACT

Described are laminate films including a polyolefin base layer, and a metal receiving layer including a blend of propylene homopolymer or mini-random propylene-ethylene copolymer, and an amorphous poly-alpha-olefin or ethylene-propylene elastomer. The metal receiving layer may also include an ethylene-propylene copolymer. The laminate film may also include additional layers such as an additional polyolefin resin-containing layer, a metal layer, or combinations thereof.

34 Claims, No Drawings

METALLIZED BIAXIALLY ORIENTED POLYPROPYLENE FILM WITH HIGH METAL ADHESION

CROSS REFERENCE TO RELATED APPLICATION

This application claims the benefit of U.S. Provisional Application Ser. No. 60/811,113, filed Jun. 6, 2006

FIELD OF INVENTION

The present disclosure relates to a multi-layer biaxially oriented polypropylene (BOPP) film. More particularly, the disclosure is related to BOPP films including a metal adhesion layer including blends of propylene homopolymer or mini-random copolymer (i.e. ethylene-propylene copolymers with a fractional ethylene content of less than 1 wt %) with amorphous poly-alpha-olefins (APAO) or ethylene-propylene elastomers.

BACKGROUND OF INVENTION

Biaxially oriented polypropylene (BOPP) metallized films used for packaging applications often perform multiple functions. For example, in a lamination these films can provide light, moisture, and oxygen barrier for gas-flush applications. In addition, these films can provide a heat sealable inner layer for bag forming and sealing, or a layer that is suitable for receiving an adhesive or inks either by coating or laminating.

It is desirable for the BOPP metallized film to have adequate adhesion between the vapor-deposited metal layer and the film's metal receiving layer. Often, the higher the bond strength between the film's receiving layer and the metal layer, the better. Higher metal adhesion can result in a more robust film in terms of barrier properties and lamination bond strengths. More specifically, by improving the metal adhesion, barrier properties are improved by minimizing the amount of metal pick-off and loss during the vacuum metallizing process and rewinding. Package lamination bond strengths are improved when a metallized film with high metal adhesion is used in a multi-layer lamination, since the interlayer bonds strengths of the laminate are improved. In thick multi-layer bags with many gussets and folds in the sealed areas (e.g. stand-up pouches), the metal layer often delaminates from the BOPP metal receiving layer. This can cause packaging failure or result in a "bag within a bag" phenomenon where the multi-layer laminate structure of the package has one of the layers delaminating. Accordingly, high metal adhesion to BOPP films is highly desirable.

Aesthetic appearance is also important. It is desired that the metallized BOPP film's metal surface has a bright, shiny, reflective appearance, and not a matte, dull, or pewter-like metal appearance. Such a shiny metal appearance is especially desirable when the package includes bright, reflective metal in the finished graphics. A bright, shiny metal appearance can make some print graphics look brighter with more visual "pop".

Another aspect of metallized BOPP robustness is to ensure that the metal layer does not "craze" during extrusion lamination processes. Due to the high heat load from the molten polyethylene that extrusion lamination can impart to the metallized BOPP film, if the metal receiving layer melts or deforms from this heat load, the metal layer can fracture and crack. This can, in turn, degrade or destroy gas and moisture vapor barrier properties of the film. Onset melting point is the temperature at which a polymer begins to show a phase change. It is desirable to design the metal receiving layer to have a relatively high onset melting point to help avoid issues with thermal shock caused by extrusion lamination.

U.S. Pat. No. 6,190,760 involves low crystalline content propylene homopolymers with a heat of fusion of 20-90 J/g as a metal receiving layer that provides high metal adhesion properties. However, it has been found to suffer from a matte metal appearance and to be prone to crazing during extrusion lamination.

U.S. Pat. No. 5,194,318 describes a HDPE as the metal receiving layer on a polypropylene substrate. Metal adhesion and appearance have been good; however, it has been found that in some high-speed extrusion lamination applications, crazing of the metal can occur, particularly if the HDPE receiving layer is over 3G (0.75 um) in thickness.

U.S. Pat. No. 5,698,317 describes blends of propylene-based polymers with petroleum or hydrocarbon resins as a metal receiving layer. Metal adhesion and appearance are adequate; however, processability is an issue with the low molecular weight petroleum resins causing: die build-up issues, smoke generation, and a tendency to stick to downstream rollers in tentering operations.

U.S. Pat. No. 5,922,471 describes propylene random copolymers of ethylene or butene as a metal receiving layer. However, these materials are prone to metal crazing during extrusion lamination due to their relatively low melting points. In addition, these materials tend to have poor barrier properties. Moreover, the copolymers used are predominantly isotactic whereas the APAO materials are predominantly atactic.

U.S. Pat. No. 5,958,566 describes an ethylene-propylene copolymer with a low ethylene content of 0.05-0.8 wt % as a metal receiving layer. The metal adhesion of such a layer continues to be relatively low being less than 100 g/in.

U.S. Pat. No. 6,033,786 describes blends of propylene-butene copolymers and ethylene-propylene copolymers combined with flame treatment as a metal receiving layer. However, such a blend with its relatively high ethylene and butene content (e.g. over 1 wt %) and low onset melting point can be prone to metal crazing.

This invention seeks to avoid some of the disadvantages of the prior arts and offer an improved metal receiving layer formulation.

SUMMARY OF THE INVENTION

Described are multi-layer biaxially oriented polypropylene (BOPP) films with a novel metal adhesion layer of blends of propylene homopolymer or mini-random copolymer (i.e. ethylene-propylene copolymers with a fractional ethylene content of less than 1 wt %) with amorphous poly-alpha-olefins (APAO) or ethylene-propylene (EP) elastomers. Films that include the metal receiving layer formulations provide high metal adhesion, a bright shiny reflective metal appearance, resistance to crazing in extrusion laminations, and excellent gas and moisture vapor barrier properties.

In one embodiment a laminate film can include a first layer of a metal receiving blend of propylene homopolymer or mini-random copolymer and APAO or EP elastomer. The laminate can further include a second polyolefin resin-containing layer on one side of the metal receiving layer. This second polyolefin resin-containing layer can be considered a core or base layer to provide the bulk strength of the laminate film. Furthermore, the laminate can include a third polyolefin resin-containing layer on the second polyolefin resin-containing core layer opposite the side with the metal receiving layer.

The first metal receiving layer can include either a blend of propylene homopolymer or a mini-random ethylene-propylene copolymer and APAO or EP elastomer. Preferably, the amount of APAO or EP elastomer is sufficient to provide excellent adhesion between the vapor-deposited metal layer and the metal receiving layer blend layer when discharge-treated.

Preferably, the second polyolefin resin-containing layer includes a propylene homopolymer or copolymer. More preferable is an isotactic propylene homopolymer to act as the core or base layer of the laminate film.

Preferably, the third polyolefin resin-containing layer includes a heat-sealable polyolefin selected from propylene copolymers, terpolymers, polyethylene and combinations thereof. In another variation, the heat-sealable layer may include an antiblock component selected from amorphous silicas, aluminosilicates, sodium calcium aluminum silicates, crosslinked silicone polymers, and polymethylmethacrylates.

The third polyolefin resin-containing layer may also include a non-heat sealable winding layer including a crystalline polypropylene and an inorganic antiblocking agent. The third polyolefin resin-containing layer may also include a winding layer including a matte layer of a block copolymer blend of propylene and one or more other monomers such as ethylene, or a blend of propylene homo- or copolymer with ethylene homopolymer forming a matte layer. The matte layer can have a roughened surface.

Preferably, the winding layer includes an antiblock component selected from amorphous silicas, aluminosilicates, sodium calcium aluminum silicates, crosslinked silicone polymers, and polymethylmethacrylates. Preferably, the winding layer is a discharge-treated winding layer having a surface for lamination or coating with adhesives or inks.

Further, the first APAO or EP elastomer blend metal receiving layer can be discharge-treated. Discharge-treatment can be accomplished by several means, including but not limited to corona, flame, plasma, or corona in a controlled atmosphere of selected gases. Preferably, in one variation, the discharge-treated APAO or EP elastomer blend metal receiving layer has a corona discharge-treated surface formed in an atmosphere of CO2 and N2. The laminate film can further include a vacuum-deposited metal layer on the APAO or EP elastomer blend metal receiving layer. Preferably, the metal layer has a thickness of about 5 to 100 nm, has an optical density of about 1.5 to 5.0, and includes aluminum. In one variation, the laminate film is an extruded laminate film.

The film can be used to form a flexible packaging for a product. Preferably, the product is a food product.

In yet another embodiment, a biaxially oriented polyolefin multi-layer film includes a skin layer of blends of propylene polymers and APAO or EP elastomer to enhance metallizing and printing properties for flexible packaging purposes.

All these films may also be metallized via vapor-deposition, preferably a vapor-deposited aluminum layer, with an optical density of at least about 1.5, preferably with an optical density of about 2.0 to 4.0, and even more preferably between 2.3 and 3.2.

Optionally, an additional layer of a heat-sealable surface or a winding surface containing antiblock and/or slip additives for good machinability and low coefficient of friction (COF) can be disposed on the second polyolefin resin-containing substrate layer, opposite the side with the metal receiving blend layer. Additionally, if this additional layer is used as a winding surface, its surface may also be modified with a discharge treatment to make it suitable for laminating or converter applied adhesives and inks.

A method of making the films may include coextruding the metal receiving layer blend and the core layer and/or other layers through a compositing die whereupon the molten multilayer film structure is quenched upon a chilled casting roll system or casting roll and water bath system and subsequently oriented in the machine and/or transverse direction into a multi-layer film.

DETAILED DESCRIPTION OF THE INVENTION

Described are biaxially oriented films and metallized films with excellent gas barrier properties. The invention helps solve the problems associated with the prior art of metallized polyolefin substrates in extrusion laminating applications.

In one embodiment a laminate film may include a mixed polyolefin resin layer including a mini-random ethylene-propylene copolymer resin layer blended with an amount of an amorphous poly-alpha-olefin. One side of the mixed polyolefin resin layer may be discharge-treated for high surface energy suitable for metallizing, printing or coating. An isotactic propylene homopolymer core layer may be located on one side of the mixed resin layer, opposite the discharge-treated side. A heat-sealable ethylene-propylene-butene terpolymer layer may be coextruded onto one side of the core layer opposite the mixed resin layer side. An aluminum metal may be vapor-deposited onto the discharge-treated surface of the mixed resin layer.

In another embodiment a film may include a similar construction as above, except that the mixed polyolefin resin layer may include a mini-random ethylene-propylene copolymer resin blended with an amount of an ethylene-propylene elastomer.

Other embodiments may include a mixed resin layer in which the mini-random ethylene-propylene copolymers of the mixed resin layer are substituted with isotactic propylene homopolymers.

The polypropylene resin core layer can be a crystalline polypropylene and can be uniaxially or biaxially oriented. The crystalline polypropylene can be a propylene homopolymer or a mini-random ethylene-propylene copolymer. As used herein, crystalline polypropylenes are polypropylenes that have an isotactic content of about 90% or greater. Suitable examples of crystalline polypropylenes include TOTAL 3270 and ExxonMobil PP4772. These resins also have melt flow rates of about 0.5 to 5 g/10 min, a melting point of about 163-167° C., a crystallization temperature of about 108-126° C., a heat of fusion of about 86-110 J/g, a heat of crystallization of about 105-111 J/g, and a density of about 0.90-0.91. The core resin layer is typically 5 µm to 50 µm in thickness after biaxial orientation, preferably between 10 µm and 25 µm, and more preferably between 12.5 µm and 17.5 µm in thickness. Additionally, an amount of cavitating agent such as calcium carbonate may be optionally included in this resin layer to produce a cavitated whitle opaque film after orientation. Preferably, up to 15 wt % calcium carbonated is added, more preferably, 5 to 7 wt % of calcium carbonate may be added. Typical useful particle sizes of the calcium carbonate range from 0.5 to 10 µm, preferably in the range of 1 to 3 µm.

The mixed resin metal receiving layer may include a blend of either a mini-random ethylene-propylene copolymer or isotactic propylene homopolyer and an amount of APAO or ethylene-propylene elastomer. Preferably, the metal receiving layer includes 85 wt % to 97 wt % propylene homopolymer or mini-random propylene-ethylene compolymer. The mini-random ethylene-propylene copolymer can be of any number of commercially available mini-random copolymers, ranging from 0.2% ethylene to about 0.8% ethylene. Suitable EP mini-random copolymers are, for example, TOTAL EOD04-37 (a nominal 0.6 wt % ethylene content mini-random copolymer of nominal 3.2 g/10 min melt flow rate, 155.9° C. melting point, 150.4° C. onset melting point, 92.8 J/g heat of fusion, and C13 NMR isotactic index of 93%) and EXXONMOBIL PP4772 (nominal 0.55 wt % ethylene content mini-random copolymer of nominal 1.6 g/10 min MFR, 157.3° C. melting point, 150.3° onset melting point, 98.2 J/g heat of fusion, and C13 NMR isotactic index of 93%). Of these mini-random EP copolymers, TOTAL EOD04-37 is particularly preferred. An optional amount of an inorganic antiblock agent can also be added to this layer, in the amount of 100-1000 ppm of the mixed resin layer, preferably 300-600 ppm.

Preferred types of antiblock agents include spherical sodium aluminum calcium silicates of nominal 3 μm in diameter. Other preferred antiblock agents include spherical inorganic antiblocks including inorganic silicas, crosslinked silicone polymers such as polymethylsilsesquioxane, and polymethylmethacrylate spheres. Useful particle sizes of these antiblocks range from 1 to 12 μm, preferably from 2 to 6 μm in diameter. Migratory slip agents such as fatty amides or low molecular weight silicone oils are not recommended as these can cause subsequent gas barrier or adhesion problems when the mixed resin layer's surface is metallized.

Suitable isotactic propylene homopolymers for the mixed resin blend metal receiving layer include TOTAL EOD02-19 (nominal 4.2 MFR) or TOTAL 3576X (nominal 8.0 MFR). An optional amount of inorganic antiblock agent can be added as mentioned previously.

Suitable amorphous poly-alpha-olefin materials include those manufactured by Degussa AG under the trade name VESTOPLAST® and grade names EP X22 and EP X35. These are ethylene-propylene-butene low molecular weight, amorphous, atactic terpolymers. VESTOPLAST APAO's are about 35 wt % ethylene and 10 wt % butene. They are characterized by a melt viscosity at 190° C. of 220 and 350 Pa-s, respectively; a $T_g$ of –32° C.; a softening point of 163° C.; a melt flow rate at 230° C. of 180-200 and 138 g/10 minutes, respectively; and a molecular weight of 130,000 and 170,000 g/mol, respectively. DEGUSSA EP X35 is preferred due to its higher molecular weight. Another suitable source for APAO materials are from Ube Industries, Ltd. CAP 330 and CAP 350 grades. These materials are blends of APAO at 30 wt % and 50 wt %, respectively, in a mini-random copolymer carrier resin to produce a masterbatch. These APAO masterbatches have melt flow indexes at 190° C. of 3.8 and 14.0 g/10 minutes, respectively; a $T_g$ of –13 and –15° C., respectively; a Vicat softening point of 105 and 68° C., respectively (per ASTM D1225); and density of 0.887 and 0.879, respectively. The APAO's are in contrast to typical ethylene-propylene-butene terpolymers used for heat sealant resin layers in coextruded BOPP films such as SUMITOMO SPX78H8 which are long-chain, high molecular weight polymers with a correspondingly significantly lower MFR of 8-11 g/10 minutes at 230° C. and molecular weights on the order of 350,000 to 400,000 g/mol.

Suitable EP elastomers include ExxonMobil Chemical's VISTAMAXX series of elastomers, particularly VISTAMAXX grades 6100, 1100, and 3000. These materials are ethylene-propylene elastomers of 16, 15, and 11 wt % ethylene content, respectively, and a Tg of about –20 to –30° C. VISTAMAXX 6100, 1100, and 3000, respectively, have a melt flow rate of 3, 4, and 7 g/10 minutes at 230° C.; a density of 0.858, 0.862, and 0.871 g/cm3; and a 200 g Vicat softening point of 48, 47, and 64° C. Particularly preferred is VISTAMAXX 3000 as this elastomer, with its lower ethylene content, is better suited for material handling being less tacky or "soft" than the other grades. Other suitable EP elastomers include DOW CHEMICAL VERSIFY elastomers, particularly grades DP3200.01, DP3300.01, and DP3400.01, which have an ethylene content of 9, 12, and 15 wt %, respectively. These grades have a melt flow rate of 8 g/10 minutes at 230° C.; a density of 0.876, 0.866, and 0.858 g/cm3, respectively; a Vicat softening point of 60, 29, and <20° C., respectively; and a Tg of –25, –28, and –31° C., respectively. VERSIFY grade DP3200.01 is more easily handled than other grades because it is less tacky or "soft."

The blending ratio of the APAO or EP elastomer in the metal receiving polyolefin layer formulation can be about 1 to 15 wt % of the layer, preferably 2 to 10 wt %, and even more preferably 3 to 5 wt %. A smaller amount is preferred to maintain the metal receiving layer's thermal resistance and make it more craze-resistant during extrusion lamination applications. The remainder of the metal receiving formulation is preferably an isotactic propylene homopolymer or mini-random propylene copolymer. In addition, an optional amount of ethylene-propylene copolymer may be added to this metal receiving layer in an amount up to 10 wt % of the layer, preferably up to 5 wt % of the layer. A suitable ethylene-propylene copolymer is TOTAL 8473, which has a nominal 4-4.5 wt % ethylene content, a 4.6 g/10 minute melt flow rate at 230° C., a density of 0.895 g/cm3, and a melting point of 135° C. The addition of a small amount of ethylene-propylene copolymer can help improve compatibility of the APAO or EP elastomer with the propylene homopolymer in the metal receiving layer. This improvement in compatibility helps reduce haziness of the film appearance and improve metal gloss appearance.

The mixed resin metal receiving layer can be coextruded on one side of the core layer having a thickness after biaxial orientation of between 0.1 and 5 μm, preferably between 0.5 and 3 μm, and more preferably between 0.5 and 1.0 μm. For the mixed resin metal receiving layer blend, it is also contemplated to add an amount of antiblock to aid in film handling. A small amount of inorganic antiblocking agent may be optionally added up to 1000 ppm by weight to this resin layer. 300 to 600 ppm of antiblock may be added.

The mixed resin metal receiving layer is also surface-treated with a corona-discharge method, flame treatment, atmospheric plasma, or corona discharge in a controlled atmosphere of nitrogen, carbon dioxide, or a mixture thereof which excludes oxygen. The latter treatment method in a mixture of CO2 and N2 is preferred. This method of discharge treatment results in a treated surface that includes nitrogen-bearing functional groups, preferably 0.3% or more nitrogen in atomic %, and more preferably 0.5% or more nitrogen in atomic %. This treated mixed resin metal receiving layer can then be metallized, printed, coated, or extrusion or adhesive laminated. Preferably, it is metallized as it is conducive to excellent metal adhesion, metal gloss, gas barrier properties, and metal craze resistance in thermal extrusion lamination applications.

A heat-sealable layer or non-heat sealable layer may be coextruded with the core layer opposite the mixed resin metal receiving layer having a thickness after biaxial orientation of between 0.2 and 5 μm, preferably between 0.6 and 3 μm, and more preferably between 0.8 and 1.5 μm. The heat-sealable layer may contain an anti-blocking agent and/or slip additives for good machinability and a low coefficient of friction in about 0.05 to 0.5% by weight of the heat-sealable layer. Preferably, non-migratory slip and antiblock additives are used to maintain gas barrier properties. Preferably, migratory low molecular weight slip additives such as any number or type of fatty amides or silicone oils should be avoided as they can transfer from the heat-sealable layer to the metal receiving layer when wound in roll form such that the heat-sealable layer is in intimate contact with the metal receiving layer for some period of time. Such low molecular weight, migratory additives on the surface of the metal receiving layer can vaporize upon the vapor-deposition of metal or aluminum during the metallizing process. This can result in holes or cracks in the metal layer which then compromises gas barrier properties.

The heat-sealable layer can be a copolymer of propylene, either ethylene-propylene or butylene-propylene, and preferably includes a ternary ethylene-propylene-butene copolymer. A suitable heat-sealable terpolymer resin is SUMITOMO SPX79H8 which also contains an amount of non-migratory inorganic antiblock of crosslinked silicone polymer of nominal 2 µm particle size.

If the film includes a non-heat sealable winding layer, this layer can include a crystalline polypropylene with anti-blocking and/or slip additives (preferably non-migratory slip additives) or a matte layer of a block copolymer blend of polypropylene and one or more other polymers whose surface is roughened during the film formation to produce a matte finish on the winding layer. Preferably, the surface of the winding layer is discharge-treated to provide a functional surface for lamination or coating with adhesives and/or inks. Discharge-treatment of this winding layer can be achieved as previously described by, for example, corona or flame treatment.

The coextrusion process may include a multi-layered compositing die, such as a two-, three-, or four-layer die. The polymer core layer can be sandwiched between the mixed resin metal receiving layer and the heat sealable or winding layer in a three-layer coextrusion configuration. Another embodiment includes coextruding only two layers with only the core layer and the metal receiving APAO/PE elastomer blend layer coextruded on one side of the core layer. In this case, the core layer side opposite the mixed resin metal receiving layer can be further modified by adding inorganic antiblock particles into the core layer itself and can be surface-treated via a discharge-treatment method.

The multilayer coextruded laminate sheet can be cast onto a cooling drum whose surface temperature is controlled between 20° C. and 60° C. to solidify the non-oriented laminate sheet. The non-oriented laminate sheet can be stretched in the longitudinal direction at about 135° C. to 165° C. at a stretching ratio of about 4 to about 6 times the original length and the resulting stretched sheet can be cooled to about 15° C. to 50° C. to obtain a uniaxially oriented laminate sheet. The uniaxially oriented laminate sheet can be introduced into a tenter and preliminarily heated to between 130° C. and 180° C., and stretched in the transverse direction at a stretching ratio of about 7 to about 12 times the original length and then heat-set or annealed to reduce internal stresses due to the orientation and minimize shrinkage and give a relatively stable biaxially oriented sheet. The biaxially oriented film may have a total thickness between 6 and 40 µm, preferably between 10 and 25 µm, and most preferably between 12 and 18 µm.

A preferred embodiment is to metallize the surface of the mixed resin metal receiving layer. The unmetallized laminate sheet is first wound in a roll. The roll is then placed in a metallizing chamber and the metal vapor-deposited on the discharge-treated mixed resin metal receiving layer surface. The metal film may include titanium, vanadium, chromium, manganese, iron, cobalt, nickel, copper, zinc, aluminum, gold, or palladium, the preferred being aluminum. Metal oxides can also be contemplated, the preferred being aluminum oxide. The metal layer may have a thickness of between 5 and 100 nm, preferably between 20 and 80 nm, more preferably between 30 and 60 nm. The metal layer may have an optical density of between 1.5 and 5.0, preferably between 2.0 and 4.0, more preferably between 2.3 and 3.2.

The metallized film can then be tested for oxygen and moisture gas permeability, optical density, metal adhesion, metal appearance and gloss, and can be made into an extrusion adhesive laminate structure to assess metal craze resistance.

EXAMPLES

This invention will be better understood with reference to the following examples, which are intended to illustrate specific embodiments within the overall scope of the invention.

Example 1

A 3-layer film is produced using coextrusion. The film includes a core layer of a polypropylene resin such as EXXONMOBIL PP4772. A mixed resin metal receiving layer of 5 wt % amorphous poly-alpha-olefin (APAO) of EP X35 grade from Degussa AG, is coextruded one side of the core layer as described in the above description.

The APAO was dry-blended with 95 wt % TOTAL EOD04-37 mini-random copolymer, which also contains ca. 300 ppm of a spherical sodium calcium aluminum silicate of nominal 3 µm particle size such as MIZUSAWA INDUSTRIAL CHEMICAL'S SILTON® JC-30 to make up the mixed resin metal receiving layer formulation. A heat-sealable terpolymer was coextruded on the side of the core layer opposite the mixed resin metal receiving layer. The total thickness of this film substrate after biaxial orientation was ca. 70G or 0.7 mil (17.5 µm). The thickness of the respective mixed resin APAO metal receiving layer and the sealant skin layers after biaxial orientation was ca. 4G (1 µm) and 6G (1.5 µm), respectively. The thickness of the core layer after biaxial orientation was ca. 60G (15 µm).

The mixed resin metal receiving layer, core layer, and heat sealant layer were melt extruded at nominal 450 to 500° F. (230 to 260° C.). The sealant layer included the ethylene-propylene-butene terpolymer SUMITOMO SPX78H8, ca. 4000 ppm of an inorganic antiblock additive such as TOSHIBA TOSPEARL 120, and a crosslinked silicone polymer of nominal 2.0 µm particle size. The sealant layer was melt extruded at 450 to 480° F. (230 to 250° C.). The 3-layer coextrudate was passed through a flat die and cast on a chill drum of 100 to 180° F. (38 to 82° C.). The formed cast sheet was passed through a series of heated rolls at 210 to 270° F. (99 to 132° C.) with differential speeds to stretch in the machine direction (MD) at ca. 5× stretch ratio. This was followed by transverse direction (TD) stretching at ca. 8× stretch ratio in the tenter oven at 310 to 350° F. (154 to 177° C.). The resultant clear film was also discharge-treated on the exposed surface of the APAO mixed resin metal receiving layer via corona treatment to a dyne level of ca. 38 to 40 dyne/cm. The clear film was subsequently metallized to an optical density of nominal 2.3 via aluminum vapor deposition upon the corona-treated APAO blend metal receiving layer and tested for oxygen gas barrier properties, metal adhesion, metal appearance, and craze resistance.

Example 2

A process similar to Example 1 was repeated except that the mixed resin metal receiving layer included a blend of 10 wt % DEGUSSA EP X35 APAO and 90 wt % TOTAL EOD04-37. The clear film was also corona-treated and metallized and tested for gas barrier properties, appearance, metal adhesion, and craze resistance.

Example 3

A process similar to Example 1 was repeated except that the mixed resin metal receiving layer included a blend of 5 wt % DEGUSSA EP X35 APAO, 5 wt % of TOTAL 8473 EP copolymer, and 90 wt % of TOTAL EOD04-37. The clear film was also corona-treated and metallized and tested for gas barrier and other properties.

Example 4

A process similar to Example 1 was repeated except that the mixed resin metal receiving layer included 10 wt % Degussa EP X35 APAO, 5 wt % TOTAL 8473, and 85 wt % TOTAL EOD04-37. The clear film was corona-treated and metallized and tested for gas barrier and other properties.

Example 5

A process similar to Example 1 was repeated except that the mixed resin metal receiving layer included 3 wt % DEGUSSA EP X35 APAO, 5 wt % TOTAL 8473, and 92 wt % TOTAL EOD04-37. The clear film was corona-treated and metallized and tested for gas barrier and other properties.

Example 6

A process similar to Example 1 was repeated except that the mixed resin metal receiving layer included 5 wt % DOW CHEMICAL DP 3400.01 EP elastomer and 95 wt % TOTAL EOD04-37. The clear film was corona-treated and metallized and tested for gas barrier and other properties.

Example 7

A process similar to Example 1 was repeated except that the mixed resin metal receiving layer included 10 wt % DP 3400.01 EP elastomer and 90 wt % TOTAL EOD040-37. The clear film was corona-treated and metallized and tested for gas barrier and other properties.

Example 8

A process similar to Example 1 was repeated except that the mixed resin metal receiving layer included 10 wt % DP 3400.01 EP elastomer, 5 wt % TOTAL 8473, and 85 wt % TOTAL EOD040-37. The clear film was corona-treated and metallized and tested for gas barrier and other properties.

Comparative Example 1

A process similar to Example 1 was repeated except that the mixed resin metal receiving layer included 100 wt % of TOTAL EOD04-37 mini-random copolymer. No APAO or EP elastomer was added to this layer. The clear film was corona-treated and metallized and tested for gas barrier and other properties.

Comparative Example 2

A process similar to Example 1 was repeated except that the mixed resin metal receiving layer included a blend of 100 wt % IDEMITSU E2900 low crystallinity propylene homopolymer with a nominal 2.8 g/10 minutes melt flow rate, a heat of fusion of about 75.9 J/g, melting point of 159.0° C., an onset melting point of 145.4° C., and a $C^{13}$ NMR isotactic index of about 74%. About 300 ppm of SILTON JC-30 sodium calcium aluminum silicate antiblock was added to the mixed resin metal receiving layer. The clear film was corona-treated and metallized and tested for gas barrier and other properties.

Comparative Example 3

A process similar to Example 1 was repeated except that the mixed resin metal receiving layer included 100 wt % of TOTAL 8473 ethylene-propylene copolymer of nominal 4.0-4.5 wt % ethylene, 4.6 g/10 min melt flow rate, melting point of about 135° C., onset melting point of about 121.7° C., and heat of fusion of about 69.6 J/g. An amount of about 300 ppm of SILTON JC-30 sodium calcium aluminum silicate antiblock was also added to the mixed resin metal receiving layer. The clear film was corona-treated and metallized and tested for gas barrier and other properties.

The unlaminated properties of the Examples and Comparative Example ("CEx.") are shown in Table 1.

TABLE 1

| Sample | Metal Receiving Layer Composition wt % | | | | | Metal Adhesion g/25 mm | Appearance[1] (1-5, 1 = v. matte, 5 = v. shiny) | $O_2$TR cc/m²/day |
|---|---|---|---|---|---|---|---|---|
| | E2900 | EOD-0437 | APAO | EP elastomer | 8473 | | | |
| Ex. 1 | 0 | 95 | 5 | 0 | 0 | Destruct* | 4 | 18.6 |
| Ex. 2 | 0 | 90 | 10 | 0 | 0 | Destruct | 4 | 21.7 |
| Ex. 3 | 0 | 90 | 5 | 0 | 5 | Destruct | 5 | 24.8 |
| Ex. 4 | 0 | 85 | 10 | 0 | 5 | Destruct | 5 | 26.4 |
| Ex. 5 | 0 | 92 | 3 | 0 | 5 | Destruct | 5 | 20.2 |
| Ex. 6 | 0 | 95 | 0 | 5 | 0 | 321 | 4 | 21.7 |
| Ex. 7 | 0 | 90 | 0 | 10 | 0 | Destruct | 4 | 25.3 |
| Ex. 8 | 0 | 85 | 0 | 10 | 5 | Destruct | 4 | 29.3 |
| CEx. 1 | 0 | 100 | 0 | 0 | 0 | 120-150 | 5 | 23.3 |
| CEx. 2 | 100 | 0 | 0 | 0 | 0 | Destruct | 2 | 37.2 |
| CEx. 3 | 0 | 0 | 0 | 0 | 100 | Destruct | 4 | 415.4 |

[1]Appearance of the metallized surface is graded 1-5, with 5 = glossy, mirror-like appearance and 1 = dull, matte appearance.
*"Destruct" metal adhesion means that the OPP substrate broke during metal adhesion testing before the metal layer could be removed. In other words, metal adhesion was stronger than the OPP substrate.

The resultant unlaminated films of Examples 1 to 8 provided excellent metal adhesion of the vapor-deposited aluminum to the mixed resin metal receiving layer containing APAO or EP elastomer as shown in Table 1. In most cases, the metal adhesion was "destructive" indicating that the metal adhesion strength was greater than the strength of the OPP substrate itself. In general, values of metal adhesion greater than 300 g/25 mm were desired, with a metal adhesion minimum target of 250 g/25 mm.

Metal appearance of Examples 1-8 were also very good, scoring a rating of 4 or 5, indicating a bright, glossy, reflective metallized appearance. A metallized appearance of 4 or higher was preferred, with a minimum of 3 (3 being marginal appearance). Below 3 was unacceptable appearance, indicated by a dull, matte, grayish or pewter-like, non-reflective metallized appearance.

Oxygen transmission barrier properties of Examples 1-8 were also acceptable, meeting the desired target of ≦31.0 cc/m2/day. O2TR values of >31.0 and ≦46.5 cc/m2/day were marginally acceptable values. O2TR values of >46.5 cc/m2/day were unacceptable.

More specifically, Examples 1 and 2 using 5 wt % and 10 wt % APAO, respectively, had a metal appearance that was very good. However, it was noted that Examples 3, 4, and 5 which used 5 wt %, 10 wt %, and 3 wt % APAO respectively, blended with 5 wt % 8473 EP copolymer, and the balance consisting of EOD04-37 as the metal receiving layer, showed incrementally better metal appearance which was improved by the addition of the small amount of EP copolymer. It is thought that the EP copolymer helps to act as a compatibilizer in dispersing the APAO in the propylene homopolymer matrix and thus, reduce overall haze and further improve appearance.

In contrast, Comparative Example 1, which used a mini-random isotactic propylene copolymer TOTAL EOD04-37 with nominal 0.6 wt % ethylene content as the metal receiving layer, also showed excellent metal appearance and oxygen barrier properties. However, its metal adhesion value was well below the 250 g/25 mm minimum target. This was probably due to the small amount of ethylene, which did not contribute much to improve metal adhesion.

Comparative Example 2, which used a low crystalline propylene homopolymer IDEMITSU E2900 as the metal receiving layer, showed excellent metal adhesion. However, its oxygen transmission barrier was marginal being greater than 31 cc/m2/day and its metal appearance was poor, with a very matte, pewter-like metal appearance.

Comparative Example 3, which used an ethylene-propylene copolymer TOTAL 8473 of nominal 4 to 4.5 wt % ethylene content as the metal receiving layer, showed excellent metal adhesion properties as well as an excellent glossy metal appearance. However, its oxygen barrier property was very poor.

The Examples and Comparative Examples were then each laminated on an extrusion lamination line. Each example was laminated to a nominal 70G (17.5 μm) BOPP transparent coex print film from Toray Plastics (America), Inc. called F61W. The metallized side of each Example and Comparative Example was laminated to the discharge-treated side of the F61W coex film using about 10 lbs/rm (ca. 15.6 μm thickness) of LDPE extrusion adhesive at a melt temperature of 610° F. (321° C.) extruded through a block die and a processing line speed of about 875 fpm (267 mpm). The LDPE adhesive contacted the metal surface of the example film first, and then was nipped to the F61W coex film. The metallized example films were configured such that the non-metallized surface was in contact with a chill roll. The resultant lamination was wound up in roll form. The laminate samples were testing and inspected for metal craze resistance. The results of these tests are shown in Table 2.

TABLE 2

| Sample | Metal Receiving Layer Composition wt % | | | | | Tm Onset (° C.) | Crazing[1] (1-4, 1 = v. crazed, 4 = no craze) |
| --- | --- | --- | --- | --- | --- | --- | --- |
| | E2900 | EOD-0437 | APAO | EP elastomer | 8473 | | |
| Ex. 1 | 0 | 95 | 5 | 0 | 0 | 148.9 | 4 |
| Ex. 2 | 0 | 90 | 10 | 0 | 0 | 148.5 | 4 |
| Ex. 3 | 0 | 90 | 5 | 0 | 5 | 150.6 | 4 |
| Ex. 4 | 0 | 85 | 10 | 0 | 5 | 147.8 | 3 |
| Ex. 5 | 0 | 92 | 3 | 0 | 5 | 149.3 | 3 |
| Ex. 6 | 0 | 95 | 0 | 5 | 0 | 150.0 | 4 |
| Ex. 7 | 0 | 90 | 0 | 10 | 0 | 150.6 | 4 |
| Ex. 8 | 0 | 85 | 0 | 10 | 5 | 149.1 | 3 |
| CEx. 1 | 0 | 100 | 0 | 0 | 0 | 150.4 | 4 |
| CEx. 2 | 100 | 0 | 0 | 0 | 0 | 145.4 | 2 |
| CEx. 3 | 0 | 0 | 0 | 0 | 100 | 121.7 | 1 |

[1]Crazing appearance of the metallized surface is graded 1-4, with 4 = no crazing observed and 1 = severe crazing observed.

The resultant laminated Examples 1-8 all showed little to no crazing of the metal surface after extrusion lamination. Craze resistance was similar to that of Comparative Example 1 (CEx. 1) which was considered the standard to match for craze resistance and exhibited excellent property in this regard. The TOTAL EOD04-37 mini-random propylene copolymer used in CEx. 1 had a relatively high onset Tm of ca. 150° C. and this onset Tm was a good indicator of craze resistance. Since the majority component of the metal receiving layer was based on the TOTAL EOD04-37 Examples 1-8 also showed similar onset Tm as CEx. 1. Accordingly, these Examples also exhibited excellent craze resistance. It was noted, however, that the addition of a small amount of EP copolymer resulted in incrementally more crazing, although still at an acceptable level.

Comparative Example 2 (CEx. 2) showed marginal craze resistance in extrusion lamination. The metal receiving layer of CEx. 2 has a lower onset Tm of ca. 145° C. which was probably marginal for resisting the thermal shock of extrusion lamination. Comparative Example 3, which used a wholly EP copolymer, had very poor extrusion lamination craze resistance, which was not surprising given its very low onset Tm of ca. 122° C.

Thus, of the foregoing Examples and Comparative Examples, only the inventive Examples 1-8 which used a small amount of modifying APAO or EP elastomer was effective in satisfying all the requirements of high metal adhesion, low oxygen transmission rate, glossy metal aesthetics, and craze resistance during extrusion lamination.

Test Methods

The various properties in the above examples were measured by the following methods:

Oxygen transmission rate of the film was measured by using a MOCON OXTRAN 2/20 unit substantially in accordance with ASTM D3985 at conditions of 73° F./0% RH (23° C./0% RH). In general, the preferred value was a value≦31.0 cc/m2/day and a maximum of 46.5 cc/m2/day.

Moisture transmission rate of the film was measured by using a MOCON PERMATRAN 3/31 unit measured substantially in accordance with ASTM F 1249 at conditions of 100° F./90% RH (38° C./90% RH). In general, the preferred value was a value≦0.31 g/m2/day and a maximum of 0.69 g/m2/day.

Optical density was measured using a TOBIAS ASSOCIATES MODEL TBX transmission densitometer. Optical density is defined as the amount of light transmitted through the test specimen under specific conditions. Optical density is reported in terms of a logarithmic conversion. For example, a density of 0.00 indicates that 100% of the light falling on the sample is being transmitted. A density of 1.00 indicates that 10% of the light is being transmitted; 2.00 is equivalent to 1%, etc.

Metal adhesion was measured by heat sealing on a SENTINAL Sealer model 12 ASL at 220° F. (104.4° C.) seal temperature, 15 second dwell, and 15 psi (103.42 kPa) seal jaw pressure, a piece of 1-mil (25 μm) thick ethylene acrylic acid polymer film (EAA) to the metallized surface of a single sheet of metallized film and measuring the 180° peel strength of the metal from the substrate substantially in accordance with AIMCAL (Association of Industrial Metallizers, Coaters, and Laminators) test procedure TP-105-92. The test procedure and a kit of materials can be obtained from AIMCAL's website www.aimcal.com. The Metal Adhesion Test Kit is designed to permit testing using TP-105-92. The test kit contains 2 rolls of 3M™ tape #610, 2 rolls of EAA film and an AIMCAL Metallizing Technical Reference Manual. The test kit contains enough material to do at least 100 tests as described in the Technical Reference Manual, (TP-105-92). The test procedure used in testing the samples used in the examples of this application is described in AIMCAL Metallizing Technical Reference (Third Edition, © 2001). In general, preferred values of metal adhesion ranged from about 250 g/25 mm or higher.

Metal crazing was assessed qualitatively by observing the laminated sample on a light table in a darkened room and judging the severity of metal fractures in a given area. Alternatively, a piece of the laminate can be examined under a light microscope at 200× magnification and a count made of the number of metal fractures and rated qualitatively as follows:
4=Excellent=No metal cracks observed or 0 cracks counted per area observed at 200×.
3=Good=few metal cracks observed or <10 cracks counted per area observed at 200×.
2=Marginal=moderate number of metal cracks or 10-20 cracks counted per area observed at 200×.
1=Poor=large number of metal cracks or >20 cracks counted per area observed at 200×.
In general, preferred values were Excellent to Good (4-3).

Metal appearance was rated qualitatively on the glossiness or shininess of the metal surface of the film using existing metallized film standards for comparison. A ranking system of 1-5 was used, with 1 equating to a very matte metallized film appearance and 5 equating to a very shiny, glossy, reflective metallized film appearance. 8½"×11" cut sheet samples of the metallized films were observed with the metal side up on a white background under office fluorescent lighting, and ranked in order of metal shininess. The rating was "calibrated" using control films CEx. 1 as a "5" and CEx. 2 as a "2" in appearance.
5=Very glossy, reflective, shiny metal (e.g. CEx. 1 is standard).
4=Good glossy and shiny metal, slight dullness or haze observed.
3=Fair gloss and shiny metal, some dullness or haze observed.
2=Matte metal appearance, little gloss or shine observed (e.g. CEx. 2 is standard).
1=Very matte appearance, no gloss or shine observed.

Metal receiving layer resin blend melting temperature (Tm) and onset melting Tm of the resin blend was measured using a differential scanning calorimeter (DSC) such as manufactured by Perkin-Elmer model DSC7 and was determined substantially in accordance with ASTM D3417-99. In general, onset Tm temperatures were preferred to be ≧ca. 145° C., with most preferred being ca. 150° C. or higher.

Surface chemistry of the discharge-treated surface was measured using ESCA surface analysis techniques. A Physical Electronics model 5700LSci X-ray photoelectron/ESCA spectrometer was used to quantify the elements present on the sample surface. Analytical conditions used a monochromatic aluminum x-ray source with a source power of 350 watts, an exit angle of 50°, analysis region of 2.0 mm×0.8 mm, a charge correction of C—(C,H) in C 1 s spectra at 284.6 eV; and charge neutralization with electron flood gun. Quantitative elements such as O, C, and N were reported in atom %. Preferred values of N-functional groups were 0.3% or more.

Wetting tension of the surfaces of interest was measured substantially in accordance with ASTM D2578-67. In general, the preferred value was an average value equal to or more than 40 dyne/cm with a minimum of 38 dyne/cm.

This application discloses several numerical ranges. The numerical ranges disclosed inherently support any range or value within the disclosed numerical ranges even though a precise range limitation is not stated verbatim in the specification because this invention can be practiced throughout the disclosed numerical ranges.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein. Finally, the entire disclosure of the patents and publications referred in this application are hereby incorporated herein by reference.

The invention claimed is:
1. A laminate film comprising:
  a polyolefin base layer; and
  a metal receiving layer comprising a blend of propylene homopolymer or mini-random propylene-ethylene copolymer, and an amorphous poly-alpha-olefin having a molecular weight of 130,000 to 170,000 g/mol, wherein a surface of the metal receiving layer that is to receive a metal layer is corona discharge treated in a controlled atmosphere of $CO_2$ and $N_2$ that excludes $O_2$ and the corona discharge treated surface comprises nitrogen-bearing functional groups comprising at least 0.3% nitrogen in atomic %.

2. The laminate film of claim 1, wherein the metal receiving layer comprises isotactic propylene homopolymer.

3. The laminate film of claim 1, wherein the metal receiving layer comprises 1 wt % to 15 wt % amorphous poly-alpha-olefin.

4. The laminate film of claim 1, wherein the metal receiving layer comprises 85 wt % to 97 wt % of propylene homopolymer or mini-random propylene-ethylene copolymer.

5. The laminate film of claim 1, wherein the metal receiving layer further comprises an ethylene-propylene copolymer.

6. The laminate film of claim 5, wherein the metal receiving layer comprises 5 wt % or less of the ethylene-propylene copolymer.

7. The laminate film of claim 5, wherein the ethylene-propylene copolymer has an ethylene content of 1.0 to 10 wt %.

8. The laminate film of claim 1, comprising a crystalline isotactic propylene homopolymer.

9. The laminate film of claim 1, comprising a mini-random propylene-ethylene copolymer comprising a crystalline isotactic polypropylene with an ethylene content of less than 1 wt %.

10. The laminate film of claim 1, wherein the polyolefin base layer comprises an isotactic crystalline propylene homopolymer.

11. The laminate film of claim 1, further comprising a vacuum deposited metal layer on the metal receiving layer.

12. The laminate film of claim 11, wherein the metal layer has a thickness of 5 to 100 nm.

13. The laminate film of claim 11, wherein the metal layer has an optical density of about 1.5 to 5.0.

14. The laminate film of claim 11, wherein the metal layer comprises aluminum.

15. The laminate film of claim 1, wherein the laminate film is an extruded laminate film.

16. The laminate film of claim 1, wherein the amorphous poly-alpha-olefin has an ethylene content of greater than 11 wt %.

17. The laminate film of claim 16, wherein the amorphous poly-alpha-olefin has an ethylene content of 11 to 35 wt %.

18. A laminate film comprising:
a polyolefin base layer; and
a metal receiving layer comprising a blend of propylene homopolymer or mini-random propylene-ethylene copolymer, and an ethylene-propylene elastomer having a density of 0.876 g/cm$^3$ or less, wherein a surface of the metal receiving layer that is to receive a metal layer is corona discharge treated in a controlled atmosphere of $CO_2$ and $N_2$ that excludes $O_2$ and the corona discharge treated surface comprises nitrogen-bearing functional groups comprising at least 0.3% nitrogen in atomic %.

19. The laminate film of claim 18, wherein the metal receiving layer comprises isotactic propylene homopolymer.

20. The laminate film of claim 18, wherein the metal receiving layer comprises 1 wt % to 15 wt % ethylene-propylene elastomer.

21. The laminate film of claim 18, wherein the metal receiving layer comprises 85 wt % to 97 wt % of propylene homopolymer or mini-random propylene-ethylene copolymer.

22. The laminate film of claim 18, wherein the metal receiving layer further comprises an ethylene-propylene copolymer.

23. The laminate film of claim 22, wherein the metal receiving layer comprises 5 wt % or less of the ethylene-propylene copolymer.

24. The laminate film of claim 22, wherein the ethylene-propylene copolymer has an ethylene content of 1.0 to 10 wt %.

25. The laminate film of claim 18, comprising a crystalline isotactic propylene homopolymer.

26. The laminate film of claim 18, comprising a mini-random propylene-ethylene copolymer comprising a crystalline isotactic polypropylene with an ethylene content of less than 1 wt %.

27. The laminate film of claim 18, wherein the polyolefin base layer comprises an isotactic crystalline propylene homopolymer.

28. The laminate film of claim 18, further comprising a vacuum deposited metal layer on the metal receiving layer.

29. The laminate film of claim 28, wherein the metal layer has a thickness of 5 to 100 nm.

30. The laminate film of claim 28, wherein the metal layer has an optical density of about 1.5 to 5.0.

31. The laminate film of claim 28, wherein the metal layer comprises aluminum.

32. The laminate film of claim 28, wherein the laminate film is an extruded laminate film.

33. The laminate film of claim 18, wherein the ethylene-propylene elastomer has an ethylene content of greater than 11 wt %.

34. The laminate film of claim 33, wherein the ethylene-propylene elastomer has an ethylene content of 11 to 16 wt %.

* * * * *